United States Patent [19]
Yasunaga et al.

[11] Patent Number: 6,118,240
[45] Date of Patent: *Sep. 12, 2000

[54] METHOD AND APPARATUS FOR SELECTING ACCELERATION OR DECELERATION OF A SUBSTRATE

[75] Inventors: Koichi Yasunaga; Takao Kashiwazaki; Makito Seno, all of Yamanashi; Hironori Konno, Kofu, all of Japan

[73] Assignee: Matsushita Electric Industrial Co., Ltd., Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/952,393

[22] PCT Filed: Mar. 12, 1997

[86] PCT No.: PCT/JP97/00784

§ 371 Date: Feb. 11, 1998

§ 102(e) Date: Feb. 11, 1998

[87] PCT Pub. No.: WO97/34822

PCT Pub. Date: Sep. 25, 1997

[30] Foreign Application Priority Data

Mar. 18, 1996 [JP] Japan ................................ 8-061054

[51] Int. Cl.$^7$ ...................................................... H02P 3/00
[52] U.S. Cl. ............................................................ 318/270
[58] Field of Search .................................. 318/638, 270, 318/271, 274, 276, 278, 146

[56] References Cited

U.S. PATENT DOCUMENTS

| | | | |
|---|---|---|---|
| 4,232,255 | 11/1980 | Carlen | 318/143 |
| 4,716,346 | 12/1987 | Matsuo | 318/38 |
| 4,876,966 | 10/1989 | Okawa et al. | 104/290 |
| 5,027,049 | 6/1991 | Pratt et al. | 318/807 |
| 5,242,096 | 9/1993 | Tsunabuchi et al. | 228/9 |
| 5,274,312 | 12/1993 | Gerstenkorn | 318/617 |

FOREIGN PATENT DOCUMENTS

| | | |
|---|---|---|
| 1-203116 | 8/1989 | Japan . |
| 3-195622 | 8/1991 | Japan . |

*Primary Examiner*—Jonathan Salata
*Attorney, Agent, or Firm*—Ratner & Prestia

[57] ABSTRACT

A board transfer unit for transferring a printed circuit board on which electronic components are mounted. The board transfer unit has sensors for detecting the length, width, and thickness of the board. The board weight is calculated based on the detected data from the sensors. The board transfer unit also receives information on types of components mounted on the board from a machine in the previous process. Optimal acceleration and deceleration rates are selected from previously prepared data based on the board weight and the types of components mounted in the previous process. Accordingly, the board transfer unit realizes the optimal board transfer corresponding to diversifying board weight and mounting conditions.

25 Claims, 3 Drawing Sheets

METHOD AND APPARATUS FOR SELECTING ACCELERATION OR DECELERATION OF A SUBSTRATE

This application is a U.S. National phase application of PCT International Application PCT/JP97/00784.

FIELD OF THE INVENTION

The present invention relates to the field of transfer units for printed circuit boards on which electronic components are mounted.

BACKGROUND OF THE INVENTION

FIG. 4 shows the outline of a transfer unit of the prior art for printed circuit boards (hereafter referred to as "board") on which electronic components are mounted. In FIG. 4, a transfer motor 21, board guide 22, and driving pulley 23 are fixed to the shaft of the transfer motor 21. A pulley 25 is disposed at both ends of the board guide 22. A belt 24 is wound around the two types of pulley 23 and 25, and runs parallel to the board guide 22.

One end of a guide width adjusting screw 26 is directly connected to a guide width adjusting motor 27, and the other end is screwed to a nut 30 provided on a support frame 32 of the board guide 22. One end of a guide rail 28 having grooves lengthwise is supported by a bearing 33 provided on a support frame 29, and the other end is loosely inserted into a bearing 33 provided on a support frame 32. A board guide 34 is fixed to a support frame 29 in parallel to the board guide 22. The board guide 34 has the same belt mechanism as the board guide 22 inside, and the belt runs synchronized to the belt 24. A cylinder 35 is provided at the end of the board guide 34 as a stopper.

The operation of a board transfer unit as configured above is explained next.

Drive power is transmitted to the belt 24 through the pulley 23 when the transfer motor 21 is rotated at the constant speed. The belt 24 then runs parallel to the board guide 22 via the pulley 23. The board is transferred by placing it on the belt 24. After starting the board transfer, the cylinder 35 is actuated, and the rotation of the transfer motor 21 is stopped when the board contacts the cylinder 35, thus stopping the board at a specified position.

Next, the operation for transferring boards with different widths is explained.

When the guide width adjusting motor 27 is rotated, the guide width adjusting screw 26 directly connected to the shaft of the guide width adjusting motor 27 also rotates. By rotation of the guide width adjusting screw 26, the nut 30 which is screwed to the guide width adjusting screw 26, moves back and forth according to the rotation direction of the guide width adjusting screw 26. Therefore, the board guide 22 remains parallel to the board guide 34 while it moves to adjust the width therebetween. The above operation allows the transfer of boards with a range of widths. FIG. 5 shows a velocity diagram of the board during transfer in the prior art.

If boards are transferred at high speed using the board transfer unit of the prior art, the transfer speed of the board will suddenly increase or decrease as shown in FIG. 5. This will apply a large acceleration or deceleration force to large, small, light, and heavy components temporarily mounted on the board and held by the adhesivity of a material such as solder paste printed on the board, causing dislocation, inclination, or dropping off of mounted components.

DISCLOSURE OF THE INVENTION

The present invention offers a board transfer unit which transfers the board at the optimal acceleration and deceleration speeds within the extent to prevent detrimental effect on mounting conditions and components on the board.

The board transfer unit of the present invention selects the optimal accelerated and decelerated speeds previously set according to the weight of the board and types of mounted components, and transfers the board on which electronic components are mounted at selected acceleration and deceleration speeds. The present invention prevents detrimental effect on mounted electronic components during the board transfer. The impact on contacting a cylinder, which is a stopper, for stopping the board can also be reduced by transferring the board at the optimal acceleration and deceleration speeds. Accordingly the present invention enables the safe and reliable transfer of boards.

The present invention is a board transfer unit which selects the optimal acceleration and deceleration speeds previously set according to the board weight and types of mounted components, and transfers the board at the selected acceleration and deceleration speeds. Detrimental effect on mounted electronic components during the board transfer can be prevented by transferring the board at the optimal acceleration and deceleration speeds, and the impact on contacting a cylinder, which is a stopper, for stopping the board can also be reduced because the board is transferred at a low speed at the moment of contact between the board and the cylinder. Accordingly, the safe and reliable transfer of boards is assured.

A preferred embodiment of the present invention selects smaller acceleration and deceleration speeds from i) the optimal acceleration and deceleration speeds selected based on the board weight, and ii) the optimal acceleration and deceleration speeds selected based on types of components mounted in the previous process. The optimal acceleration and deceleration speeds are selected from two pairs of acceleration and deceleration speeds. This also assures the safe and reliable transfer of boards.

The present invention further comprises means for automatically recognizing the board weight. The means for recognizing the board weight is provided for selecting the optimal acceleration and deceleration speeds.

The present invention further comprises means for receiving information on components mounted on the board from a machine in the previous process. Further optimal acceleration and deceleration speeds can be thus selected by receiving information on components mounted on the board from the machine in the previous process.

DESCRIPTION OF THE PREFERRED EMBODIMENTS

An exemplary embodiment of the present invention is explained with reference to FIG. 1.

Figure 1:
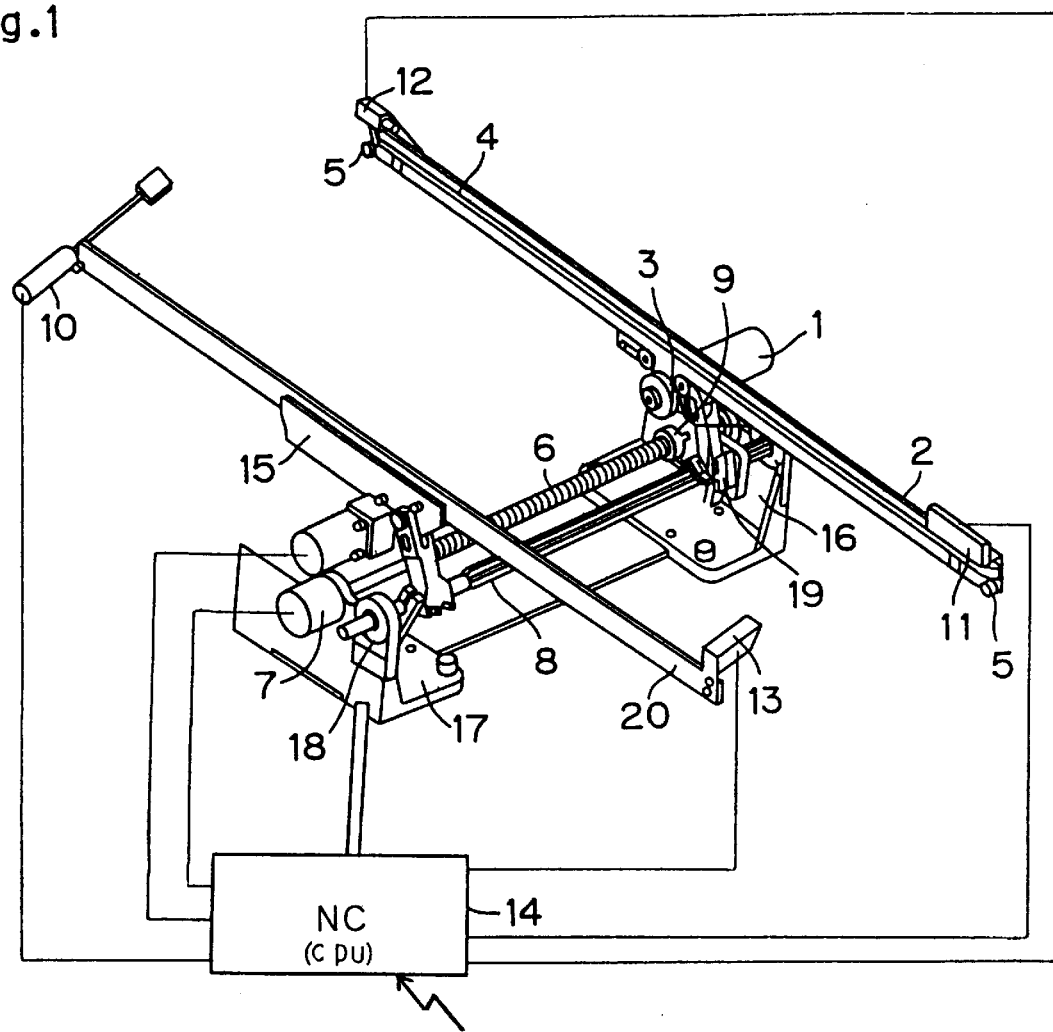
FIG. 1 is an outline of a board transfer unit of the present invention.

In FIG. 1, a transfer motor 1, board guide 2, and driving pulley 3 are fixed to the shaft of the transfer motor 1. A pulley 5 is disposed at both ends of the board guide 2. A belt 4 is wound around two types of pulley 3 and 5, and runs parallel to the board guide 2. One end of a guide width adjusting screw 6 is directly connected to the shaft of a guide width adjusting motor 7, and the other end of the guide width adjusting screw 6 is screwed to a nut 9 provided on a support frame 16 of the board guide 2.

One end of a guide rail 8 having grooves lengthwise is supported by a bearing 18 provided on a support frame 17, and the other end is loosely inserted into a bearing 19 provided on a support frame 16. A board guide 20 is fixed to a support 15 on the support frame 17 in parallel to the board guide 2. The board guide 20 has the same belt mechanism as the board guide 2 inside, and the belt runs synchronized to the belt 4. A cylinder 10 is provided at the end of the board guide 20 as a stopper. Sensors 11, 12, and 13 respectively detect the length, width, and thickness of the board. A controller 14 controls the board transfer and also receives information from a machine in the previous process about components mounted on the board.

The operation of the board transfer unit as configured above is explained next.

Drive force is transmitted to the belt 4 through the driving pulley 3 when the transfer motor 1 is rotated. The belt 4 runs parallel to the board guide 2 via the pulley 5. The board is transferred by placing it on a pair of belts 4. After completing transfer, the cylinder 10 actuates when the board contacts it, and stops the rotation of the transfer motor 1, thus stopping the board.

The operation for transferring boards with different widths is explained next.

When the guide width adjusting motor 7 is rotated, the guide width adjusting screw 6 directly connected to the shaft of the guide width adjusting motor 7 also rotates.

By rotation of the guide width adjusting screw 6, a nut screwed to the guide width adjusting screw 6 moves back and forth according to the rotation direction of the guide width adjusting screw 6. Therefore, the board guide 2 remains parallel to the board guide 20 while it moves to adjust the width. The above operation allows the support and transfer of boards of a range of widths.

Figure 2:
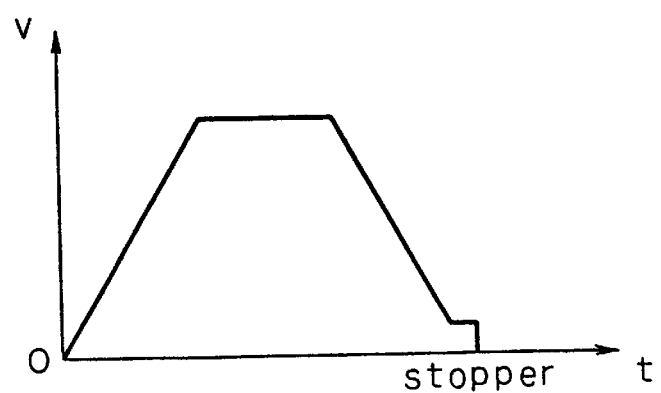
FIG. 2 is an example of a board transfer velocity diagram of the present invention.
Figure 3:
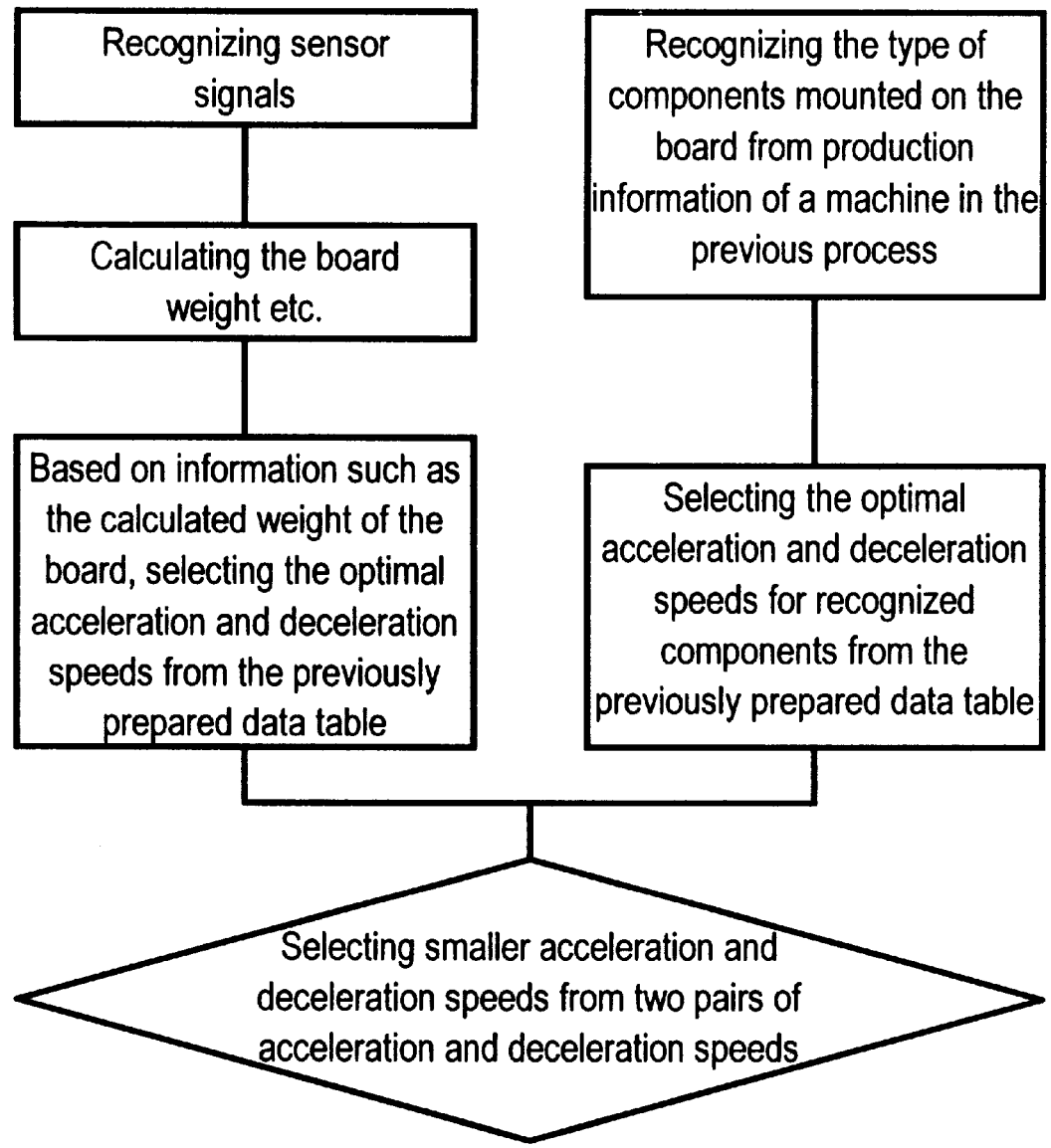
FIG. 3 is an operation flow of the present invention.
Figure 4:
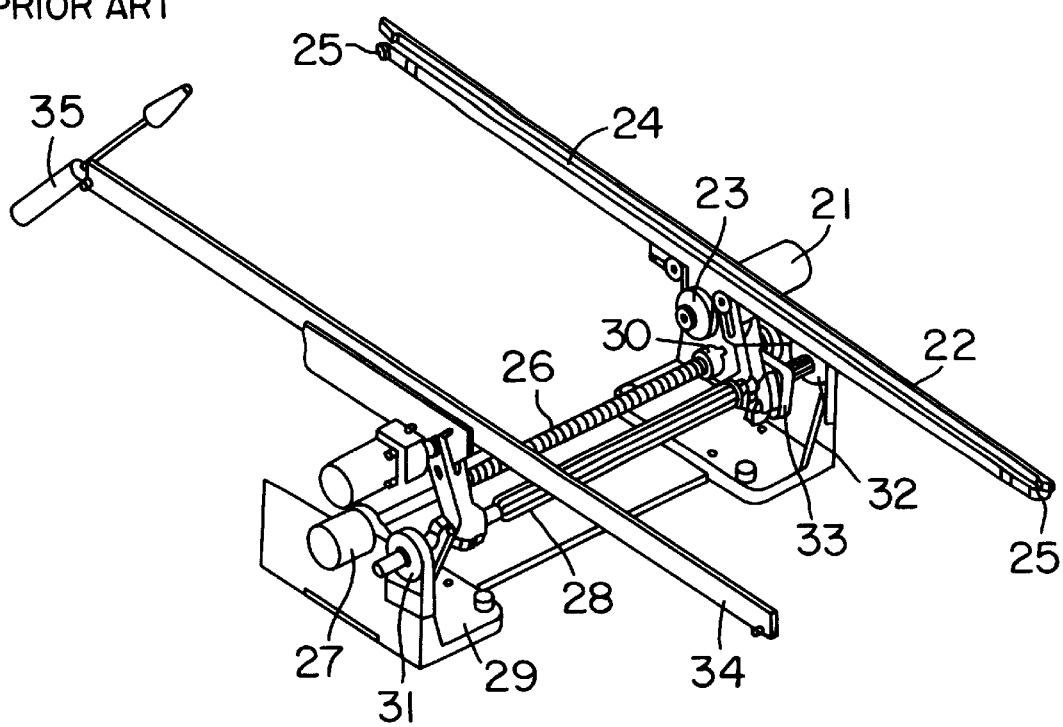
FIG. 4 an outline of the prior art.
Figure 5:
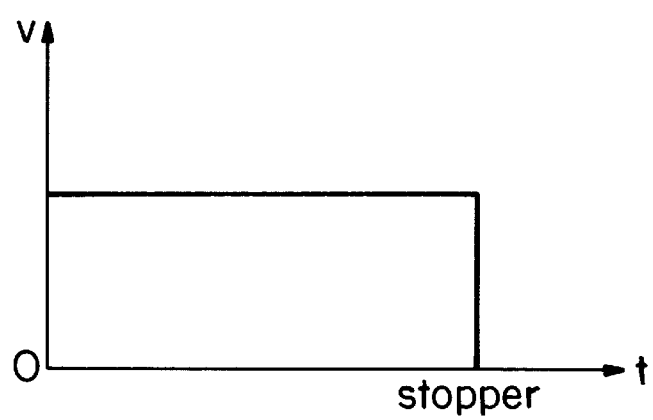
FIG. 5 is an example of board transfer velocity diagram of the prior art.

FIGS. 1, 2, and 3 explain the operation of the board transfer unit as configured above.

The controller 14 detects the length, width, and thickness of the board using the sensors 11, 12, and 13, and calculates the weight of the board to be transferred based on specific gravity previously registered for automatically recognizing the board weight.

Next, the controller 14 recognizes the type of components mounted on the board from production information received when communicating with the controller (not illustrated) of a machine in the previous process.

Then, based on information such as the calculated weight of the board to be transferred and the type of components mounted on the board, the controller 14 selects the optimal acceleration and deceleration speeds from the previously prepared data table.

The board is controlled and transferred according to the selected acceleration and deceleration speeds, which form a trapezoidal speed curve as shown in FIG. 2. This curve is set to minimize the impact on contact with the stopper, taking into account the weight of the board.

Smaller acceleration and deceleration speeds from two pairs of acceleration and deceleration speeds selected by the controller as described above are selected as the optimal acceleration and deceleration speeds for driving the transfer motor 1.

Drive force is transmitted to the belt 4 through the driving pulley 3 when the transfer motor 1 is rotated. The belt 4 then moves parallel to the board guide 2 via the pulleys 5 to transfer the board placed on a pair of belts 4. After starting transfer, the board stops on contacting the cylinder 10, which is the stopper. Since the controller 14 is transferring the board at an extremely low speed at the moment of contact between the board and the stopper, the impact force can be sharply reduced.

INDUSTRIAL APPLICABILITY

The present invention transfers the board at the optimal acceleration and deceleration speeds to prevent any detrimental effect on the electronic components mounted on the board during transfer. In addition, it reduces the impact with the stopper by reducing the transfer speed at that point. Accordingly, the present invention enables the safe and reliable transfer of boards and electronic components mounted or temporarily mounted on the board.

What is claimed is:

1. A board transfer unit for transferring a printed circuit board on which electronic components are mounted, comprising:
    a selector which selects at least one of an optimal acceleration rate and an optimal deceleration rate based on a weight of the printed circuit board and the electronic components mounted on the printed circuit board, and
    a transfer unit which transfers the printed circuit board in accordance with at least one of the selected optimal acceleration rate and the optimal deceleration rate.

2. A board transfer unit as defined in claim 1, wherein said board transfer unit selects at least one of a smaller acceleration rate and a smaller deceleration rate as the optimal acceleration rate and optimal deceleration rate, respectively, from:
    i) a first acceleration rate and a first deceleration rate based on the weight of the printed circuit board, and
    ii) a second acceleration rate and a second deceleration rate based on components mounted on the printed circuited board in a previous process.

3. A board transfer unit as defined in claim 1, wherein said board transfer unit comprising means for automatically recognizing the weight of the printed circuit board.

4. A board transfer unit as defined in claim 1, wherein said board transfer unit comprising means for receiving information on types of electronic components mounted on the printed circuit board from a machine in the previous process.

5. A board transfer unit as defined in claim 2, wherein said board transfer unit comprising means for automatically recognizing the weight of the printed circuit board.

6. A board transfer unit as defined in claim 2, wherein said board transfer unit comprising means for receiving information on types of electronic components mounted on the printed circuit board from a machine in the previous process.

7. An apparatus for transferring a substrate comprising:
    a board guide for guiding and supporting the substrate;
    a motor coupled to the board guide for transferring the substrate from a first position to a second position on the board guide; and a controller coupled to the motor for controlling at least one of an acceleration and a deceleration of the substrate based on the weight of the substrate and components on the substrate.

8. The apparatus of claim 7, further comprising a plurality of sensors for sensing at least one of i) a length, ii) a width, iii) a thickness of the substrate.

9. The apparatus of claim 7, wherein the substrate has a plurality of components applied to a surface of the substrate.

10. The apparatus of claim 7, wherein at least one of an acceleration rate and a deceleration rate are based on at least one of i) a weight, ii) a length, iii) a thickness, and iv) a component compliment of the substrate.

11. The apparatus of claim 7, further comprising:
a width adjuster for adjusting a width of the apparatus responsive to a signal from the controller.

12. The apparatus of claim 7, wherein the substrate is a circuit board.

13. The apparatus of claim 7, wherein the controller receives information based on a component compliment of the substrate and at least on of the acceleration and deceleration based on the information.

14. An apparatus for transferring a substrate comprising:
guide means for guiding and supporting the substrate;
transfer means coupled to the guide means for transferring the substrate from a first position to a second position; and
controller means coupled to the transfer means for controlling at least one of an acceleration and a deceleration of the substrate based on the weight of the substrate and components on the substrate.

15. A method for transferring a substrate comprising the steps of:
(a) receiving data representing at least one physical characteristic of the substrate;
(b) calculating a weight of the substrate based on the at least one physical characteristic received in step (a);
(c) receiving an indication of components mounted on the substrate;
(d) determining at least one of an acceleration rate and a deceleration rate based on the substrate weight calculated in step (b) and the components indicated as being mounted on the substrate in step (c); and
(e) transferring the substrate in accordance with at least one of the acceleration rate and the deceleration rate.

16. The method of claim 15, wherein the step (c) further comprises the steps of:
(c1) determining a component compliment of the substrate; and
(c2) selecting at least one of a smaller one of i) the acceleration rate and a predetermined acceleration rate and ii) the deceleration rate and a predetermined deceleration rate, based on the component compliment determined in step (c1).

17. A board transfer unit according to claim 1, further comprising a detector for detecting physical dimensions of said board and for calculating weight of said board based on said physical dimensions.

18. A board transfer unit according to claim 1, further comprising recognition means for recognizing said electronic components mounted on said printed circuit board, and for selecting at least one of said optimal acceleration rate and said optimal deceleration rate based on said recognized components.

19. A board transfer unit according to claim 1, further comprising a plurality of board guides situated substantially in parallel, along which said board is moved, distance between said board guides adjustable to any of a plurality of widths.

20. An apparatus for transferring a substrate according to claim 7, further comprising a detector for detecting physical dimensions of said board and for calculating weight of said board based on said physical dimensions, wherein said controller controls said acceleration and deceleration of said substrate based on said calculated weight.

21. An apparatus for transferring a substrate according to claim 7, further comprising recognition means for recognizing electronic components mounted on said substrate, and for selecting at least one of said acceleration and said deceleration of said substrate based on said recognized components.

22. An apparatus for transferring a substrate according to claim 14, further comprising a detector for detecting physical dimensions of said substrate and for calculating weight of said substrate based on said physical dimensions, wherein at least one of said acceleration and deceleration of said substrate are controlled based on said calculated weight.

23. An apparatus for transferring a substrate according to claim 14, further comprising recognition means for recognizing electronic components mounted on said substrate, wherein said controller means controls at least one of said acceleration and said deceleration of the substrate based on said recognized components.

24. A method for transferring a substrate according to claim 15, wherein said physical characteristic of the substrate is a physical dimension of the substrate.

25. An apparatus for transferring a substrate according to claim 15, further comprising the steps of recognizing components mounted on said substrate, wherein in step c), at least one of said acceleration rate and said deceleration rate is determined based on said detected components.

* * * * *